United States Patent
Shi et al.

(10) Patent No.: US 10,217,645 B2
(45) Date of Patent: Feb. 26, 2019

(54) CHEMICAL MECHANICAL POLISHING (CMP) OF COBALT-CONTAINING SUBSTRATE

(71) Applicant: AIR PRODUCTS AND CHEMICALS, INC., Allentown, PA (US)

(72) Inventors: Xiaobo Shi, Chandler, AZ (US); James Allen Schlueter, Phoenix, AZ (US); Mark Leonard O'Neill, Gilbert, AZ (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 14/800,323

(22) Filed: Jul. 15, 2015

(65) Prior Publication Data

US 2016/0027657 A1    Jan. 28, 2016

Related U.S. Application Data

(60) Provisional application No. 62/029,145, filed on Jul. 25, 2014.

(51) Int. Cl.
*H01L 21/311* (2006.01)
*C09G 1/02* (2006.01)

(52) U.S. Cl.
CPC .......... *H01L 21/31111* (2013.01); *C09G 1/02* (2013.01)

(58) Field of Classification Search
CPC .............................. H01L 21/31111; C09G 1/02
See application file for complete search history.

(56) References Cited

U.S. PATENT DOCUMENTS

| | | | |
|---|---|---|---|
| 2004/0084414 A1 | 5/2004 | Sakai et al. | |
| 2005/0003744 A1 | 1/2005 | Feng et al. | |
| 2006/0002023 A1 | 1/2006 | Le et al. | |
| 2006/0219663 A1 | 10/2006 | Wang et al. | |
| 2011/0059680 A1* | 3/2011 | Motonari ................. | C09G 1/02 451/36 |
| 2013/0140273 A1* | 6/2013 | Lu ............................ | C09G 1/02 216/53 |
| 2013/0186850 A1 | 7/2013 | Wang et al. | |
| 2014/0014872 A1* | 1/2014 | Tamada ................... | C09G 1/02 252/79.1 |
| 2014/0243250 A1* | 8/2014 | Miller ................. | H01L 21/3212 510/175 |

FOREIGN PATENT DOCUMENTS

| | | |
|---|---|---|
| CN | 104513627 A | 4/2015 |
| EP | 1209731 A1 | 5/2002 |
| EP | 2662427 A2 | 11/2013 |
| EP | 2818526 A1 | 12/2014 |
| JP | 2010028080 | 2/2010 |
| KR | 1020110137802 | 12/2011 |
| KR | 1011673060000 | 7/2012 |
| KR | 1020130066561 | 6/2013 |
| KR | 1020130126536 | 11/2013 |

OTHER PUBLICATIONS

Integrated Modeling of Chemical Mechanical Planarization for Sub-Micron IC . . . By Jianfeng Luo, David Dornfeld (p. 90)(2004). Used Only as Evidence.*
Jayashankar, Jay, et al., Electrochemical Characterization of Transition Metal CMP, Proceedings of 203rd ECS Meeting, Paris, France, May 2, 2003.
Nishizawa, Hideak, et al., Fundamental Study of Chemical-Mechanical Polishing Slurry of Cobalt Barrier Metal for Next-Generation Interconnect Process, Japan J. Appl. Phys., vol. 49, 2010.
Lu, Hai-Sheng, et al., The Effect of H202 and 2-MT on the Chemical Mechanical Polishing of Cobalt Adhesion Layer in Acid Slurry, Electrochem and Solid-State Letters, issue 4, pp. H97-H100.
Peethala, B.C., et al., Cobalt Polishing with Reduced Galvanic Corrosion at Copper/Cobalt Interface Using Hydrogen Peroxide as an Oxidizer in Colloidal Silica-Based Slurries, Journal of the Electrochemical Society, vol. 159, Issue 6, pp. H582-H588, 2012.
Liang Jiang, et al, "Synergetic effect of H2O2 and glycine on cobalt CMP in weakly alkaline slurry", Microelectronic Engineering, 2014, 82-86.
Hai-Sheng Lu, et al, "The Effect of Glycine and Benzotriazole on Corrosion and Polishing Properties of Cobalt in Acid Slurry", Journal of the Electrochemical Society, 2012, C383-C387.

* cited by examiner

*Primary Examiner* — Duy Vu N Deo
*Assistant Examiner* — Mahmoud Dahimene
(74) *Attorney, Agent, or Firm* — Lina Yang

(57) ABSTRACT

Chemical mechanical polishing (CMP) compositions, methods and systems for polish cobalt or cobalt-containing substrates are provided. Dual, or at least two chelators were used in the CMP polishing compositions as complexing agents for achieving the unique synergetic effects to afford high, tunable Co removal rates and with low static etch rates on Co film surface for the efficient Co corrosion protection during CMP process. The cobalt chemical mechanical polishing compositions also provide very high selectivity of Co film vs. other barrier layers, such as Ta, TaN, Ti, and TiN, and dielectric film, such as TEOS, SiNx, low-k, and ultra low-k films.

7 Claims, 10 Drawing Sheets

CHEMICAL MECHANICAL POLISHING (CMP) OF COBALT-CONTAINING SUBSTRATE

CROSS-REFERENCE TO RELATED APPLICATIONS

This patent application is a non-provisional of U.S. provisional patent application Ser. No. 62/029,145, filed on Jul. 25, 2014, which is incorporated herein by reference in its entirety.

BACKGROUND OF THE INVENTION

The present invention relates generally to chemical mechanical polishing (CMP) of semiconductor substrates.

As industry standards trend toward smaller device features, there is a continuous developing need for new types of metal materials that can be used to replace (W) or copper (Cu) as new electrical conducting interconnection materials in IC chip fabrication and integration, specifically, for 16 nm technology nodes and beyond applications. Cobalt (Co) has been considered and tested as one of the promising new type of metal inter-connection material in IC chip integration. CMP of cobalt interconnect requires polishing of cobalt layer at high removal rates and provide high degree of planarity without introducing corrosion defects. Cobalt interconnect polishing requires removal rates in excess of 1000 Angstroms/minute, which requires slurry compositions which are chemically aggressive to cobalt and yet not cause any corrosion issues.

Unfortunately, existing slurries for polishing of copper or tungsten cannot be used to give satisfactory CMP performance for cobalt interconnect structures. Without being limited to any particular theory, this may be due to cobalt being chemically reactive with the existing polishing slurries, resulting in cobalt dissolution, which in turn leads to a high defect count.

Most of the prior art on cobalt CMP relates to polishing thin cobalt barrier liners underneath the copper interconnects. The requirement of cobalt barrier polishing are quite different from cobalt interconnect polishing. Cobalt barrier polish require cobalt removal rates typically less than 500 Angstroms/min.

US Patent Application 20130186850 or WO2013112490 (Applied Materials) teaches a slurry for chemical mechanical polishing of a cobalt interconnect or a cobalt barrier layer. The slurry includes abrasive particles, an organic complexing compound for Cu or Co ion complexion, a Co corrosion inhibitor that is 0.01-1.0 wt % of the slurry, an oxidizer, and a solvent. The slurry has a pH of 7-12.

US Patent Application 20130140273 teaches slurry for chemical mechanical polishing of Co. The slurry comprises components by weight as follows, inhibitor 0.01-2%, oxidant 0-5%, abrasive 0.1-10%, complexing agent 0.001-10%, and the rest of Water. The pH value of the slurries is adjusted to 3-5 by a pH value adjustor. The inhibitor is chosen from one or more kinds of five-membered heterocycle compound containing S and N atoms or containing S or N atom. The oxidant is one or more chosen from $H_2O_2$, $(NH_4)_2S_2O_8$, $KIO_4$, and $KClO_5$. The abrasive is one or more chosen from $SiO_2$, $CeO_2$, and $Al_2O_3$. The complexing agent is one or more chosen from amino acid and citric acid. The slurry can effectively prevent Co over corrosion and reduce the polishing rate of Co in the polishing process.

"Fundamental Study of Chemical-Mechanical Polishing Slurry of Cobalt Barrier Metal for Next-Generation Interconnect Process," Hideak Nishizawa et al., Jpn. J. Appl. Phys., Vol. 49, 05FC03 (2 pages), 2010 show that in slurries with pH 10, a passivation layer is formed on cobalt surface and cobalt-copper galvanic corrosion is minimized.

"The Effect of H2O2 and 2-MT on the Chemical Mechanical Polishing of Cobalt Adhesion Layer in Acid Slurry," Hai-Sheng Lu et al., Electrochem. and Solid-State Letters, Vol. 15, Issue 4, pp. H97-H100 (2012). The work demonstrates that $H_2O_2$ greatly increases the static etch rate (SER) and removal rate (RR) of cobalt. The 2-Mercaptothiazoline (2-MT) is very efficient at inhibiting cobalt corrosion and reducing the SER and RR of cobalt in the acid slurry. In the glycine based slurry at pH=5, by using 2-MT, the corrosion potential difference between Co and Cu can be reduced to a very small value.

"Cobalt Polishing with Reduced Galvanic Corrosion at Copper/Cobalt Interface Using Hydrogen Peroxide as an Oxidizer in Colloidal Silica-Based Slurries," B. C. Peethala et al., Journal of the Electrochemical Society, Vol. 159, Issue 6, pp. H582-H588 (2012) used colloidal silica-based slurry with 1 wt % $H_2O_2$ as the oxidizer and 0.5 wt % arginine as the complexing agent for CMP on cobalt; this slurry showed superior performance (better post-polish surface quality and no pit formation) at pH 10 compared to pH 6 and 8. At pH 10, there is no measurable dissolution of Co and an open circuit potential ($E_{oc}$) difference of about 20 mV between Cu and Co, suggestive of reduced galvanic corrosion. The results also suggest that, during polishing, the Co film surface was covered with a passive film, possibly of Co (III) oxides. Addition of 5 mM BTA to this slurry inhibited Cu dissolution rates and yielded a Co/Cu removal rate ratio of about 1.2 while further reducing the $E_{oc}$ difference between Cu and Co to about 10 mV, both very desirable attributes.

Thus, there is a strong need for the development of innovative Co CMP polishing compositions that can provide high, tunable Co film removal rates, low Co film static etch rates, low barrier film and dielectric film removal rates, high and desirable selectivity of Co vs. barrier films and Co vs. dielectric films, and minimize or eliminate the possible galvanic corrosion at Co/Cu interface.

BRIEF SUMMARY OF THE INVENTION

The needs are satisfied by using the disclosed compositions, methods, and planarization systems for CMP of cobalt-containing substrate.

In one aspect, CMP polishing compositions are provided for CMP of cobalt-containing substrate. The CMP polishing composition comprises:
  an abrasive typically colloidal silica;
  at least two chelators typically selected from the group consisting of at least two amino acids; at least two amino acid derivatives, or at least one amino acid and at least one amino acid derivative;
  remaining is substantially deionized Water (DI water); and
  optionally:
  a chemical additive as corrosion inhibitor or a defect reducing agent;
  an oxidizing agent;
  pH adjusting agents;
  biocide; and
  a surfactant.

In another aspect, CMP polishing compositions are provided for CMP of cobalt-containing substrate. The CMP polishing composition comprises:
  an abrasive typically colloidal silica;

at least two amino acids chelators comprising glycine and alanine remaining is substantially deionized Water (DI water); and optionally:
a chemical additive as corrosion inhibitor or a defect reducing agent;
an oxidizing agent;
pH adjusting agents;
biocide; and
a surfactant.

In yet another aspect, a process of using the Co CMP polishing composition is provided for CMP of cobalt-containing substrate. The process comprises steps of:

a) providing a semiconductor substrate having a surface containing Co;
b) providing a polishing pad;
c) providing a chemical mechanical polishing composition comprising
an abrasive typically colloidal silica;
at least two chelators typically selected from the group consisting of at least two amino acids; at least two amino acid derivatives, or at least one amino acid and at least one amino acid derivative;
remaining is substantially DI water; and
optionally:
a chemical additive as corrosion inhibitor or a defect reducing agent;
an oxidizing agent;
pH adjusting agents;
biocide; and
a surfactant;
c). contacting the surface containing Co with the polish pad and the chemical mechanical polishing composition; and
d). polishing the surface containing Co.

In yet another aspect, a process of using the Co CMP polishing composition is provided for CMP of cobalt-containing substrate. The process comprises steps of:

d) providing a semiconductor substrate having a surface containing Co;
e) providing a polishing pad;
f) providing a chemical mechanical polishing composition comprising
an abrasive typically colloidal silica;
at least two chelators comprising glycine and alanine;
remaining is substantially DI water; and
optionally:
a chemical additive as corrosion inhibitor or a defect reducing agent;
an oxidizing agent;
pH adjusting agents;
biocide; and
a surfactant;
c). contacting the surface containing Co with the polish pad and the chemical mechanical polishing composition; and
d). polishing the surface containing Co.

In yet another aspect, a method of a selective chemical mechanical polishing comprising steps of:

a) providing a semiconductor substrate having a surface containing a first material and at least one second material;
wherein the first material is Co and the second material is selected from the group consisting of dielectric films (such as TEOS, $SiN_x$), low-k and ultra low-k films, and barrier films (such as Ta, TaN, Ti, and TiN films);
b) providing a polishing pad;
c) providing a chemical mechanical polishing composition comprising
an abrasive typically colloidal silica;
at least two chelators typically selected from the group consisting of at least two amino acids; at least two amino acid derivatives, and at least one amino acid and at least one amino acid derivative;
remaining is substantially DI water; and
optionally:
a chemical additive as corrosion inhibitor or a defect reducing agent;
an oxidizing agent;
pH adjusting agents;
biocide; and
a surfactant;
d) polishing the surface of the semiconductor substrate to selectively remove the first material;
wherein at least a portion of the surface is in contact with both the polishing pad and the chemical mechanical polishing composition; and ratio of removal rate of the first material to removal rate of the second material is equal or greater than 1.

In yet another aspect, a method of a selective chemical mechanical polishing comprising steps of:

a) providing a semiconductor substrate having a surface containing a first material and at least one second material;
wherein the first material is Co and the second material is selected from the group consisting of dielectric films (such as TEOS, $SiN_x$), low-k and ultra low-k films, and barrier films (such as Ta, TaN, Ti, and TiN films);
b) providing a polishing pad;
c) providing a chemical mechanical polishing composition comprising
an abrasive typically colloidal silica;
at least two chelators comprising glycine and alanine
remaining is substantially DI water; and
optionally:
a chemical additive as corrosion inhibitor or a defect reducing agent;
an oxidizing agent;
pH adjusting agents;
biocide; and
a surfactant;
d) polishing the surface of the semiconductor substrate to selectively remove the first material;
wherein at least a portion of the surface is in contact with both the polishing pad and the chemical mechanical polishing composition; and ratio of removal rate of the first material to removal rate of the second material is equal or greater than 1.

In yet another aspect, a CMP system is provided for CMP of cobalt-containing substrate. The CMP system comprises:

a) providing a semiconductor substrate having a surface containing a first material and at least one second material;
wherein the first material is Co and the second material is selected from the group consisting of dielectric films (such as TEOS, $SiN_x$), low-k and ultra low-k films, and barrier films (such as Ta, TaN, Ti, and TiN films);
b) providing a polishing pad;
c) providing a chemical mechanical polishing composition comprising
an abrasive typically colloidal silica;

at least two chelators typically selected from the group
consisting of at least two amino acids; at least two
amino acid derivatives, and at least one amino acid
and at least one amino acid derivative;
remaining is substantially DI water; and
optionally:
a chemical additive as corrosion inhibitor or a defect
reducing agent;
an oxidizing agent;
pH adjusting agents;
biocide; and
a surfactant;
wherein at least a portion of the semiconductor substrate is in contact with both the polishing pad and
the chemical mechanical polishing composition.

In yet another aspect, a CMP system is provided for CMP of cobalt-containing substrate. The CMP system comprises:
d) providing a semiconductor substrate having a surface containing a first material and at least one second material;
wherein the first material is Co and the second material is selected from the group consisting of dielectric films (such as TEOS, $SiN_x$), low-k and ultra low-k films, and barrier films (such as Ta, TaN, Ti, and TiN films);
e) providing a polishing pad;
f) providing a chemical mechanical polishing composition comprising
an abrasive typically colloidal silica;
at least two chelators comprising glycine and alanine
remaining is substantially DI water; and
optionally:
a chemical additive as corrosion inhibitor or a defect reducing agent;
an oxidizing agent;
pH adjusting agents;
biocide; and
a surfactant;
wherein at least a portion of the semiconductor substrate is in contact with both the polishing pad and
the chemical mechanical polishing composition.

The chemical mechanical polishing (CMP) polishing compositions have pH from about 2.0 to about 12; preferably from 5.0 to 10.0; and more preferably from 7.0 to 9.0. 3.5, but less than 8.5 were preferred. Compositions with pH ranges from 5.0 to 8.3 is most preferred.

The chemical mechanical polishing (CMP) polishing compositions comprise from 0.005 wt % to 25 wt %; preferably from 0.05 wt % to 5 wt %, and more preferably from 0.1 wt % to 2.5 wt % of abrasive; wherein the abrasive is selected from the group consisting of nano-sized colloidal silica or high purity colloidal silica particles; nano-sized inorganic metal oxide particles selected from the group consisting of alumina, titania, zirconia, ceria and combinations thereof; nano-sized diamond particles; nano-sized silicon nitride particles; mono-modal, bi-modal, or multi-modal colloidal abrasive particles; organic polymer-based soft abrasives; surface-coated or modified abrasives; and combinations thereof.

The chemical mechanical polishing (CMP) polishing compositions comprise from 0.05 wt % to 10 wt %, preferably from 0.55 wt % to 2.20 wt %, and more preferably from 0.825 wt % to 1.65 wt % of at least two chelators; wherein the at least two chelators selected from the group consisting of DL-Alanine, D-Alanine, L-Alanine, Glycine, Serine, Proline, Histidine, Isoleucine, Leucine, Lysine, Methionine, Phenylalanine, Threonine, Tryptophan, Valine, Arginine, Asparagine, Aspartic acid, cystein, Glutamic acid, Glutamine, Ornithine, Selenocystein, Tyrosine, Sarcosine, Bicine, Tricine, Aceglutamide, N-Acetylaspartic acid, Acetylcarnitine, Acetylcysteine, N-Acetylglutamic acid, Acetylleucine, Acivicin, S-Adenosyl-L-homocysteine, Agaritine, Alanosine, Aminohippuric acid, L-Arginine ethyl ester, Aspartame, Aspartylglucosamine, Benzylmercapturic acid, Biocytin, Brivanib alaninate, Carbocisteine, N(6)-Carboxymethyllysine, Carglumic acid, Cilastatin, Citiolone, Coprine, Dibromotyrosine, Dihydroxyphenylglycine, Eflornithine, Fenclonine, 4-Fluoro-L-threonine, N-Formylmethionine, Gamma-L-Glutamyl-L-cysteine, 4-(γ-Glutamylamino)butanoic acid, Glutaurine, Glycocyamine, Hadacidin, Hepapressin, Lisinopril, Lymecycline, N-Methyl-D-aspartic acid, N-Methyl-L-glutamic acid, Milacemide, Nitrosoproline, Nocardicin A, Nopaline, Octopine, Ombrabulin, Opine, Orthanilic acid, Oxaceprol, Polylysine, Remacemide, Salicyluric acid, Silk amino acid, Stampidine, Tabtoxin, Tetrazolylglycine, Thiorphan, Thymectacin, Tiopronin, Tryptophan tryptophylquinone, Valaciclovir, Valganciclovir and combinations thereof; wherein the preferred at least two chelators are Glycine and Alanine selected from the group consisting of DL-Alanine, D-Alanine, L-Alanine, The chemical mechanical polishing (CMP) polishing compositions comprise from 0.005 wt % to 0.5 wt %; preferably from 0.05 wt % to 0.15 wt % pH adjusting agent; wherein the pH adjusting agent is selected from the group consisting of nitric acid, hydrochloric acid, sulfuric acid, phosphoric acid, sodium hydride, potassium hydroxide, ammonium hydroxide, tetraalkylammonium hydroxide, organic amines, and mixtures thereof; wherein the preferred pH adjusting agent is nitric acid.

The chemical mechanical polishing (CMP) polishing compositions comprise from 0.01 wt % to 0.5 wt %; preferably from 0.05 wt % to 0.15 wt % pH adjusting agent; wherein the pH adjusting agent is selected from the group consisting of nitric acid, hydrochloric acid, sulfuric acid, phosphoric acid, sodium hydride, potassium hydroxide, ammonium hydroxide, tetraalkylammonium hydroxide, organic amines, and mixtures thereof; wherein the preferred pH adjusting agent is nitric acid.

The chemical mechanical polishing (CMP) polishing compositions comprise from 0.0005 wt % to 0.25 wt % preferably from 0.0025 wt % to 0.15 wt % and more preferably from 0.05 wt % to 0.1 wt % of corrosion inhibitor, wherein the corrosion inhibitor is selected from the group consisting of 1,2,4-triazole and its derivatives, benzotriazole and its derivatives, 1,2,3-triazole and its derivatives, pyrazole and its derivatives, imidazole and its derivatives, benzoimidazole and its derivatives, benzoimidazole and its derivatives, isocyanurate and its derivatives, and mixtures thereof.

The chemical mechanical polishing (CMP) polishing compositions comprise from 0.0001 wt % to 0.10 wt %, preferably from 0.0001 wt % to 0.005 wt %, and more preferably from 0.0002 wt % to 0.0025 wt % of a biocide; wherein the biocide includes but is not limited to quaternary ammonium compounds and chlorine compounds include but are not limited to methylisothiazolinone, tetramethylammonium chloride, tetraethylammonium chloride, tetrapropylammonium chloride, alkylbenzyldimethylammonium chloride and alkylbenzyldimethylammonium hydroxide, wherein the alkyl chain ranges from 1 to about 20 carbon atoms; chloro-contining compound including sodium chlorite and sodium hypochlorite; iguanide; aldehyde; ethylene oxide; metallic salt, isothizonone; chloro-containing compound; indophor; KATHON™ and NEOLENE™ product families commercially available from Dow chemicals and Preventol™ family from Lanxess.

The chemical mechanical polishing (CMP) polishing compositions comprise from 0.0005 wt % to 0.15 wt %, preferably from 0.001 wt % to 0.05 wt %, and more preferably from 0.0025 wt % to 0.025 wt % of a surfactant; wherein the surfactant is anionic, cationic, nonionic and zwitterionic surfactants; includes but is not limited to dodecyl sulfates, sodium salts or potassium salts, lauryl sulfates, secondary alkane sulfonates, alcohol ethoxylate, acetylenic diol surfactant, most quaternary ammonium based surfactants, amphoteric surfactants, such as betaines and amino acid derivatives based surfactants; and any combination thereof. Examples of suitable commercially available surfactants include TRITON™, Tergitol™, DOWFAX™ family of surfactants manufactured by Dow Chemicals and various surfactants in SUIRFYNOL™, DYNOL™, Zetasperse™, Nonidet™, and Tomadol™ surfactant families, manufactured by Air Products and Chemicals. Suitable surfactants of surfactants may also include polymers comprising ethylene oxide (EO) and propylene oxide (PO) groups. An example of EO-PO polymer is Tetronic™ 90R4 from BASF Chemicals. An example of acetylenic diol surfactant is Dynol™607 from Air Products and Chemicals.

The ratio of removal rate of the first material to the removal rate of the second material is preferably equal or greater than 60; preferably 100, more preferably 300, most preferably 700.

Other aspects, features and embodiments of the invention will be more fully apparent from the ensuing disclosure and appended claims.

DETAILED DESCRIPTION OF THE INVENTION

Figure 1:
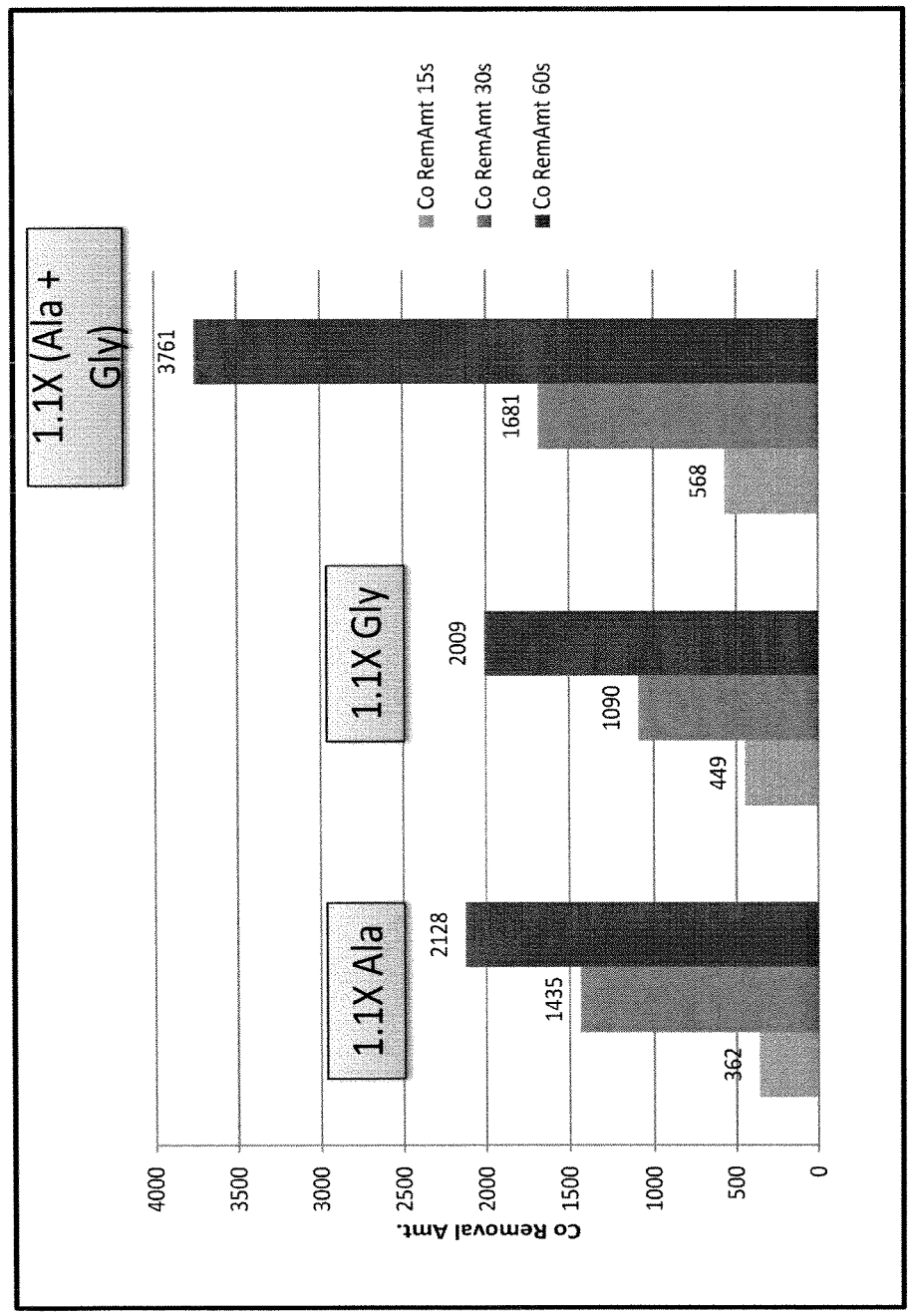
FIG. 1 shows Co removal amount (thickness in Å) at 15 s, 30 s, 60 s using Co CMP compositions having dual chelators vs. a single chelator

Chemical mechanical polishing (CMP) compositions (or CMP slurries), methods and system for polish cobalt or cobalt-containing substrates are disclosed herein.

With disclosed dual chelators combination, the Co bulk CMP polishing compositions are able to provide desirable high and tunable Co film removal rates; low barrier film and dielectric film removal rates; reduced Co film static etch rates (SER) for better Co film corrosion protection; high and desirable removal selectivity of cobalt vs. dielectric films such as TEOS, $SiN_x$ with x ranging $1.0<x<1.5$, low-k, and ultra low-k films, and cobalt vs. barrier films such as Ta, TaN, Ti, and TiN films; and minimized or eliminated the possible galvanic corrosion at Co/Cu interface by tuning open circuit potentials of both Co and Cu films.

Static etch rate is a measurement that provides empirical data related to the chemical activity level of a CMP slurry. Typically, a higher static etch rate indicates a more aggressive chemical composition that leads to the relative fast etching of the related metal film surfaces, with a higher probability of causing more metal corrosion defects. It is very important to have efficient corrosion protection on Co film surface during and after a Co bulk CMP process. Therefore, it is essential for the Co CMP to provide low SER (static etch rate) in Co bulk CMP polishing.

The general composition of the cobalt bulk CMP polishing compositions disclosed herein comprises abrasive, the dual chelators, and other selected suitable chemical additive such as corrosion inhibitors; surfactants or surface wetting agents for better surface wetting and surface tension reduction; pH adjusting agents to optimize pH operation window for the optimized polish performances; oxidizing agents; biocides; and liquid carrier.

Abrasive used for Co CMP polishing compositions include, but are not limited to, nano-sized colloidal silica or high purity colloidal silica particles, nano-sized inorganic metal oxide particles, such as alumina, titania, zirconia, ceria and combinations thereof, nano-sized diamond particles, nano-sized silicon nitride particles, mono-modal, bi-modal, multi-modal colloidal abrasive particles, organic polymer-based soft abrasives, surface-coated or modified abrasives, and mixtures thereof. The nano-sized particles have narrow or broad particle size distributions, various sizes and various shapes. The various shapes of the abrasives include spherical shape, cocoon shape, aggregate shape and other shapes, the colloidal silica particles doped by other metal oxide within lattice of the colloidal silica, such as alumina doped silica particles, colloidal aluminum oxide, which include alpha-, beta-, and gamma-types of aluminum oxides, colloidal and photoactive titanium dioxide, cerium oxide, colloidal cerium oxide.

The particle size of the abrasive particles measured by dynamic light scattering technique can range from 5 nm to 500 nm, more preferably the particle size range may be between 20 nm and 200 nm and most preferably between 40 and 150 nm.

The Co bulk CMP polishing compositions preferably contain 0.005 wt % to 25 wt % abrasives; the preferred concentration of abrasives ranges from 0.05 wt % to 5 wt %. The most preferred concentration of abrasives ranges from 0.1 wt % to 2.5 wt %.

Dual chelators as chelating agents are used as complexing agents for achieving the unique synergetic effects to afford high and tunable Co removal rates along with low static etch rates on Co film surface for the efficient Co corrosion protection during CMP process. The dual chelators typically are selected from the group consisting of two amino acids, two amino acid derivatives, and one amino acid and one amino acid derivative.

Amino acids and amino acid derivatives that can be used as dual chelators in Co bulk CMP polishing compositions include but are not limited to: DL-Alanine, D-Alanine, L-Alanine, Glycine, Serine, Proline, Histidine, Isoleucine, Leucine, Lysine, Methionine, Phenylalanine, Threonine, Tryptophan, Valine, Arginine, Asparagine, Aspartic acid, cystein, Glutamic acid, Glutamine, Ornithine, Selenocystein, Tyrosine, Sarcosine, Bicine, Tricine, Aceglutamide, N-Acetylaspartic acid, Acetylcarnitine, Acetylcysteine, N-Acetylglutamic acid, Acetylleucine, Acivicin, S-Adenosyl-L-homocysteine, Agaritine, Alanosine, Aminohippuric acid, L-Arginine ethyl ester, Aspartame, Aspartylglucosamine, Benzylmercapturic acid, Biocytin, Brivanib alaninate, Carbocisteine, N(6)-Carboxymethyllysine, Carglumic acid, Cilastatin, Citiolone, Coprine, Dibromotyrosine, Dihydroxyphenylglycine, Eflornithine, Fenclonine, 4-Fluoro-L-threonine, N-Formylmethionine, Gamma-L-Glutamyl-L-cysteine, 4-(γ-Glutamylamino)butanoic acid, Glutaurine, Glycocyamine, Hadacidin, Hepapressin, Lisinopril, Lymecycline, N-Methyl-D-aspartic acid, N-Methyl-L-glutamic acid, Milacemide, Nitrosoproline, Nocardicin A, Nopaline, Octopine, Ombrabulin, Opine, Orthanilic acid, Oxaceprol, Polylysine, Remacemide, Salicyluric acid, Silk amino acid, Stampidine, Tabtoxin, Tetrazolylglycine, Thiorphan, Thymectacin, Tiopronin, Tryptophan tryptophylquinone, Valaciclovir, Valganciclovir.

The Co bulk CMP polishing compositions preferably contain 0.05 wt % to 10 wt % dual chelators; the preferred concentration of dual chelators ranges from 0.55 wt % to 2.20 wt %. The more preferred concentration of dual chelators ranges from 0.825 wt % to 1.65 wt %. The most preferred concentration of dual chelators ranges from 1.1 wt % to 1.375 wt %.

Oxidizers used for the cobalt bulk CMP slurries include, but are not limited to, periodic acid, hydrogen peroxide, potassium iodate, potassium permanganate, ammonium persulfate, ammonium molybdate, ferric nitrate, nitric acid, potassium nitrate, and mixtures thereof. The preferred oxidizer is hydrogen peroxide.

The Co CMP slurry of this invention preferably contains 0.1 wt % to 10 wt % oxidizer; the preferred oxidizer concentration ranges from 0.25 wt % to 3 wt %, and the most preferred oxidizer concentration ranges from 0.5 wt % to 1.5 wt % pH adjusting agents used for Co cobalt bulk CMP slurries include, but are not limited to, nitric acid, hydrochloric acid, sulfuric acid, phosphoric acid, other inorganic or organic acids, and mixtures thereof. pH adjusting agents also include those basic pH adjusting agents, such as sodium hydride, potassium hydroxide, ammonium hydroxide, tetraalkylammonium hydroxide, organic amines, and other chemical reagents that are able to be used to adjust pH towards more alkaline direction. The preferred pH adjusting agent is nitric acid.

The CMP slurry of this invention preferably contains 0.005 wt % to 0.5 wt % pH adjusting agent; the preferred concentration of pH adjusting agent ranges from 0.05 wt % to 0.15 wt %.

Corrosion inhibitors used for the cobalt bulk CMP slurry include, but are not limited to, nitrogenous cyclic compounds such as 1,2,3-triazole, 1,2,4-triazole, 1,2,3-benzotriazole, 5-methylbenzotriazole, benzotriazole, 1-hydroxybenzotriazole, 4-hydroxybenzotriazole, 3-amino-1,2,4-triazole, 4-amino-4H-1,2,4-triazole, 5 amino triazole, benzimidazole, benzothiazoles such as 2,1,3-benzothiadiazole, triazinethiol, triazinedithiol, and triazinetrithiol, pyrazoles, imidazoles, isocyanurate such as 1,3,5-Tris(2-hydroxyethyl), and mixtures thereof. Preferred inhibitors are 1,2,4-triazole, 5 amino triazole and 1,3,5-Tris(2-hydroxyethyl)isocyanurate.

The Co bulk CMP polishing compositions preferably contain 0.0005 wt % to 0.25 wt % corrosion inhibitor; the preferred concentration of corrosion inhibitor ranges from 0.0025 wt % to 0.15 wt %. The most preferred concentration of corrosion inhibitor ranges from 0.05 wt % to 0.1 wt %.

CMP polishing compositions comprise biocides to prevent bacterial and fungal growth during storage. Some of the additives to control biological growth are disclosed in U.S. Pat. No. 5,230,833 (Romberger et al.) and US Patent Application No. US 20020025762, the disclosures of which are incorporated herein by reference in their entireties.

The biocide includes but is not limited to methylisothiazolinone; methylchloroisothiazolinone; quaternary ammonium compounds and chlorine compounds include but are not limited to tetramethylammonium chloride, tetraethylammonium chloride, tetrapropylammonium chloride, alkylbenzyldimethylammonium chloride and alkylbenzyldimethylammonium hydroxide, wherein the alkyl chain ranges from 1 to about 20 carbon atoms; chloro-contining compound including sodium chlorite and sodium hypochlorite; biguanide; aldehyde; ethylene oxide; metallic salt, isothiazolinone; chloro-containing compound; indophor; KATHON™ and NEOLENE™ product families commercially available from Dow chemicals and Preventol™ family from Lanxess.

The Co bulk CMP polishing compositions comprise from 0.0001 wt % to 0.10 wt %, preferably from 0.0001 wt % to 0.005 wt %, and more preferably from 0.0002 wt % to 0.0025 wt % of a biocide;

Surfactants or surface wetting agents used for Co cobalt bulk CMP slurries include, but are not limited to non-ionic surfactants including alcohol ethoxylates; acetylenic diol surfactants; anionic surfactants including alkane sulfonates, dodecyl sulfate, sodium salts, lauryl sulfates, and potassium salts; cationic surfactants including quaternary ammonium based surfactants; and zwitterionic(amphoteric) surfactants including betaine and amino acid derivatives based surfactants.

Examples of suitable commercially available surfactants include TRITON™, Tergitol™, DOWFAX™ family of surfactants manufactured by Dow Chemicals and various surfactants in SUIRFYNOL™, DYNOL™, Zetasperse™, Nonidet™, and Tomadol™ surfactant families, manufactured by Air Products and Chemicals. Suitable surfactants of surfactants may also include polymers comprising ethylene oxide (EO) and propylene oxide (PO) groups. An example of EO-PO polymer is Tetronic™ 90R4 from BASF Chemicals. An example of acetylenic diol surfactant is Dynol™607 from Air Products and Chemicals.

The Co bulk CMP polishing compositions preferably contain 0.0005 wt % to 0.15 wt % surfactants; the preferred concentration of surfactants ranges from 0.001 wt % to 0.05 wt % The most preferred concentration of surfactants ranges from 0.0025 wt % to 0.025 wt %.

Polishing compositions may be prepared such that the chemical components in the composition are concentrated before shipping and subsequently diluted at point of use with DI water addition. This would help in reduction of shipping costs. Preferably components may be concentrated in the range of 1 to 1000 times the concentration at the point of use. More preferably the ratio of concentrations between as shipped formulation to point of use formulation may be between 5 and 100.

WORKING EXAMPLES

The features and advantages of the invention are more fully shown by the following non-limiting examples.

Experimental Section

Polishing Pad Polishing pad, Fujibo Pad was used during CMP, supplied by Fujibo Echime Co., Ltd.

Parameters:
Å: angstrom(s)—a unit of length
BP: back pressure, in psi units
CMP: chemical mechanical planarization=chemical mechanical polishing
CS: carrier speed
DF: Down force: pressure applied during CMP, units psi
min: minute(s)
ml: milliliter(s)
mV: millivolt(s)
psi: pounds per square inch
PS: platen rotational speed of polishing tool, in rpm (revolution(s) per minute)
SF: polishing composition flow, ml/min
Removal Rates and Selectivity
Co RR 1.0 psi Measured Cobalt removal rate at 1.0 psi down pressure of the CMP tool General Experimental Procedure All percentages are weight percentages unless otherwise indicated.

In the examples presented below, CMP experiments were run using the procedures and experimental conditions given below.

The CMP tool that was used in the examples is a Mira®, manufactured by Applied Materials, 3050 Boweres Avenue, Santa Clara, Calif., 95054. A Fujibo pad, supplied by Fujibo Echime Co., Ltd., was used on the platen for the blanket wafer polishing studies. Pads were broken-in by polishing twenty-five dummy oxide (deposited by plasma enhanced CVD from a TEOS precursor, PETEOS) wafers. In order to qualify the tool settings and the pad break-in, two PETEOS monitors were polished with Syton® OX-K colloidal silica, supplied by Planarization Platform of Air Products Chemicals Inc. at baseline conditions. Polishing experiments were conducted using blanket PVD cobalt wafer with 5K Angstroms in thickness, and TEOS wafer. These blanket wafers were purchased from Silicon Valley Microelectronics, 1150 Campbell Ave, CA, 95126.

The associated methods described herein entailed use of the aforementioned composition for chemical mechanical planarization of substrates comprised of cobalt. In the methods, a substrate (e.g., a wafer with Co surface or Co plug) was placed face-down on a polishing pad which was fixedly attached to a rotatable platen of a CMP polisher. In this manner, the substrate to be polished and planarized was placed in direct contact with the polishing pad. A wafer carrier system or polishing head was used to hold the substrate in place and to apply a downward pressure against the backside of the substrate during CMP processing while the platen and the substrate were rotated. The polishing composition (slurry) was applied (usually continuously) on the pad during CMP processing for effective removal of material and planarizing the substrate.

DL-Alanine, D-Alanine and L-Alanine in the examples were all purchased from BTP PHARMACEUTICAL CO. LTD. (HIGH HOPE INT'L GROUP) Room 2306, Jinfeng Mansion, No. 19 Zhongyang Road, Nanjing, 210008, P.R. China. Glycine is purchased Chattem Chemicals Inc. 3708 St. Elmo Avenue Chattanooga, Tenn. 37409, US.

Experimental results did not show any difference when DL-Alanine, D-Alanine or L-Alanine was used. Thus, general name alanine was used to represent all three of them in this application.

The polishing composition and associated methods described herein are effective for CMP of a wide variety of substrates, including most of substrates having, particularly useful for polishing cobalt substrates.

Example 1

Three concentrated cobalt bulk CMP polishing compositions were prepared with one or single chelator (either glycine or alanine) and dual chelators (glycine and alanine).

Three compositions all comprised of 0.50 wt % high purity colloidal silica particles having mean particles size about 72 nm; 0.0002 wt % Kathon II as biocide; 0.002 wt % ethylinediamine; 0.00025 wt % 1,3,5-Tris(2-hydroxyethyl) isocyanurate; 0.095 wt % 3-amino-1,2,4-triazole; 0.0075 wt % dynol 607 (ethoxylated acetylenic diol surfactant); potassium hydroxide used as pH adjusting agent; and 1.0 wt % $H_2O_2$ uses as oxidizing agent.

In addition, three compositions comprised of (1) 0.45 wt % glycine, 0.65 wt % alanine; (2) 1.10 wt % glycine, or (3) 1.10 wt % alanine; respectively.

The rest of the composition was DI Water (DIW). pH value of the compositions was around 8.

The composition with (1) (1) 0.45 wt % glycine, 0.65 wt % alanine, i.e. with dual chelators (glycine and alanine) was named 1× concentrated cobalt bulk CMP polishing composition.

Using the soft pad and at relative low down force (1.0 psi), the Co bulk CMP polishing compositions having single chelator or dual chelators, were used to polish Co film.

The polish results at 15 seconds, 30 seconds, or 60 seconds respectively were listed in Table 1 and FIG. 1.

With dual chelator combination approach, the unexpected and unique synergetic effects were achieved.

TABLE 1

Comparison of Dual Chelator Combo. Vs. Single Chelator on Co RR

| Sample | Concentration (wt %) | Co Removal 15 s | Co Removal 30 s | Co Removal 60 s |
|---|---|---|---|---|
| Alanine | 1.1 | 362 Å | 1435 Å | 2128 Å |
| Glycine | 1.1 | 449 Å | 1090 Å | 2009 Å |
| Alanine + Glycine | 1.1 | 568 Å | 1681 Å | 3761 Å |

As shown in Table 1 and FIG. 1, Co RR was enhanced with the dual chelator combination approach. The Co bulk CMP polishing compositions offered high cobalt removal rates (Co RR). Co RR at 60 s (1 minute), for example, a Co film removal rate of 3761 Å was achieved with 1.1 wt % concentration of dual chelators (alanine and glycine), which represented almost 77 wt % Co film removal rate of 2128 Å boosting than using 1.1 wt % alanine alone as the chelator, and 87 wt % Co film removal rate of 2009 Å boosting than using 1.1 wt % glycine alone as the chelator.

Therefore, the Co bulk CMP polishing compositions disclosed in present invention afforded high Co film removal rate boosting through the synergetic effects of dual chelators in the compositions.

Example 2

Three cobalt bulk CMP polishing compositions having same chemical constituents except particle sizes of the high purity colloidal silica particles were tested in this example.

Similar to the compositions used in Example 1, three cobalt bulk CMP polishing compositions all had 0.50 wt % high purity colloidal silica particles; 0.45 wt % glycine; 0.65 wt % alanine; 0.0002 wt % Kathon II as biocide; 0.002 wt % ethylinediamine; 0.00025 wt % 1,3,5-Tris(2-hydroxyethyl)isocyanurate; 0.095 wt % 3-amino-1,2,4-triazole or 1,2,4-triazole; 0.0075 wt % dynol 607 or 604 surfactant (ethoxylated acetylenic diol surfactants); potassium hydroxide used as pH adjusting agent; and 1.0 wt % $H_2O_2$ uses as oxidizing agent.

The rest of the composition was DI water (DIW). pH value for the compositions was around 8.

The particle sizes of the high purity colloidal silica particles in three CMP polishing compositions were different. The particle sizes increased from colloidal silica #1 to #2 to #3 gradually. Listed colloidal silica particles #1, 2, 3 in Table 1 had particle sizes of: about 50 nm, 67 nm; and 72 nm, respectively.

Figure 2:
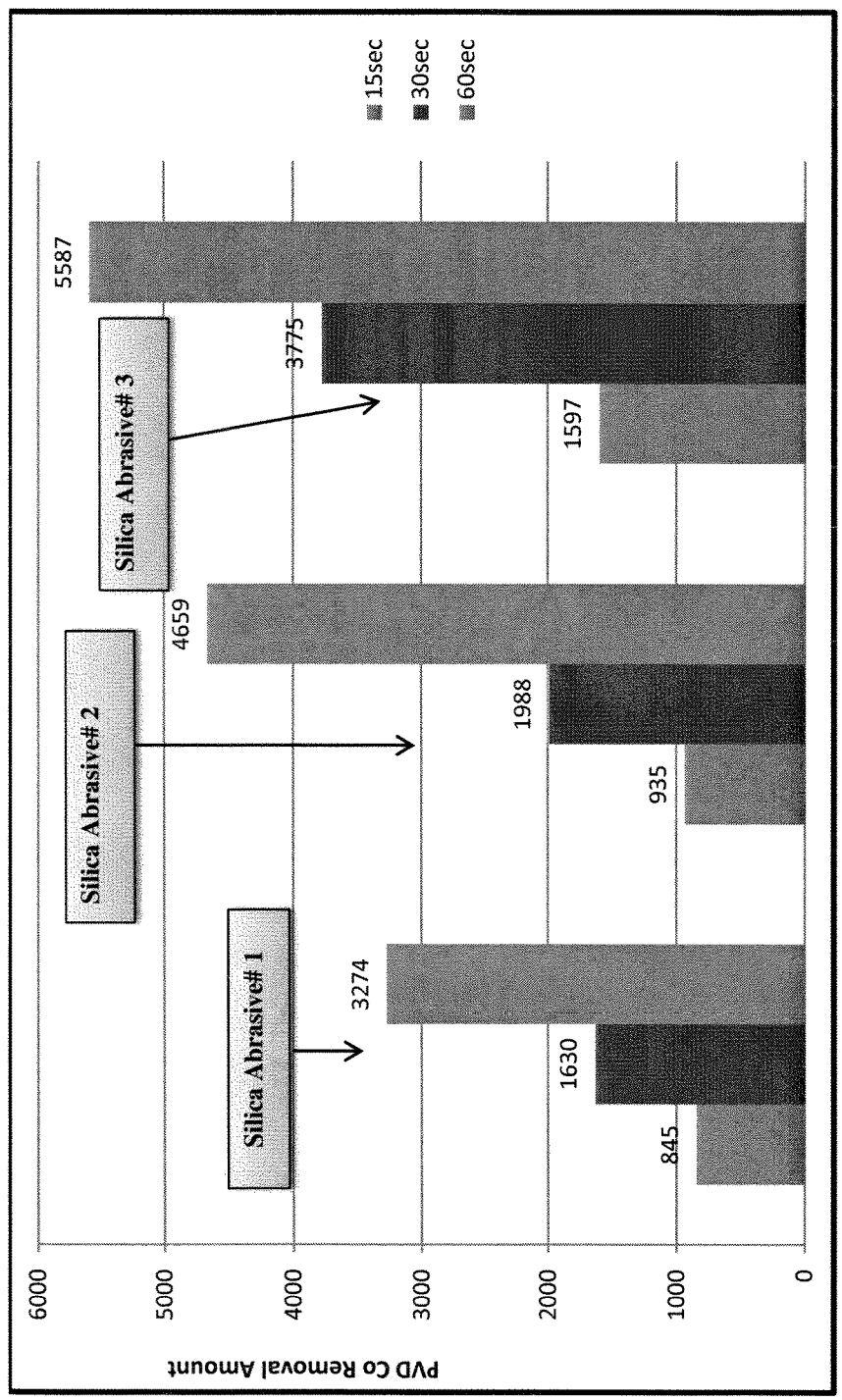
FIG. 2 shows Co removal rates as a function of particle size of colloidal silica abrasives in Co CMP compositions.

The polish results of using the Co bulk CMP polishing compositions having dual chelators with different colloidal silica particle sizes, using the soft pad and at relative low down force (1.0 psi), were listed in Table 2 and depicted in FIG. 2.

As data showed in Table 2 and FIG. 2, the Co bulk CMP polishing compositions offered high cobalt removal rates (Co RR) of >3000 Å/min. The Co RR scaled linearly with polish times with all three types of colloidal silica particles used as abrasives.

TABLE 2

The Effects of Types of Colloidal Silica on Co Removal Amount or Rates

| Sample | Co RR(Å/15 s) | Co RR (Å/30 s) | Co RR (Å/min.) |
| --- | --- | --- | --- |
| Colloidal Silica #1 | 846 | 1630 | 3274 |
| Colloidal Silica #2 | 935 | 1988 | 4659 |
| Colloidal Silica #3 | 1597 | 3775 | 5587 |

Furthermore, the cobalt removal rates were increased as the sizes of colloidal silica particles increased. Type 3 colloidal silica also yielded the highest Co film removal rate among three types of colloidal silica particles being used.

Example 3

The static etch rates (SER) were measured when the 1× concentrated cobalt bulk CMP polishing composition was used for polishing Co films. Two sets of both PVD Co films and CVD Co films were tested.

The SER (Å/min.) results with Co CMP formulation using type 3 colloidal silica abrasives were listed in Table 3.

As the static etch rate data showed in Table 3, the Co bulk chemical mechanical polishing compositions gave quite low static etch rates on both PVD Co films and CVD Co films.

TABLE 3

SER (Å/min.) of Co Bulk CMP Formulation with -#3 Colloidal Silica

| Type of Film | Sample | Co SER (Å/min.) |
| --- | --- | --- |
| CVD Co | 1X Conc. Formulation | 5.19. |
| PVD Co | 1X Conc. Formulation | 2.46 |
| CVD Co | 1X Conc. Formulation | 5.32 |
| PVD Co | 1X Conc. Formulation | 2.67 |

The polishing results indicated that the Co Bulk CMP slurries afforded higher Co SER (Å/min.) on CVD Co films than those Co removal rates on PVD Co films. Typically, about 20-25 wt % higher Co removal rates were observed on CVD Co film than that on PVD Co film. However, the static etch rates were still <5.5 Å/min.

Similar low static etch rates were also observed when #1 or #2 colloidal silica particles were used as abrasives.

Such low static etch rates indicated that the Co bulk chemical mechanical polishing compositions provided good Co film corrosion protection during and after chemical mechanical planarization processes.

Example 4

Co bulk CMP polishing compositions were prepared using 0.50 wt % high purity colloidal silica particles (mean particle size was about 72 nm); 0.45 wt % glycine; 0.65 wt % alanine; 0.0002 wt % Kathon II as biocide; 0.002 wt % ethylinediamine; 0.00025 wt % 1,3,5-Tris(2-hydroxyethyl) isocyanurate; 0.095 wt % 3-amino-1,2,4-triazole; 0.0075 wt % dynol 607; potassium hydroxide used as pH adjusting agent; and 1.0 wt % $H_2O_2$ uses as oxidizing agent. The rest was DI water.

Various concentrations (0.005 wt % to 0.10 wt %) of KOH were used to adjust pH of the compositions The Co removal rates of the Co bulk CMP polishing compositions were measured as a function of pH condition.

Figure 3:
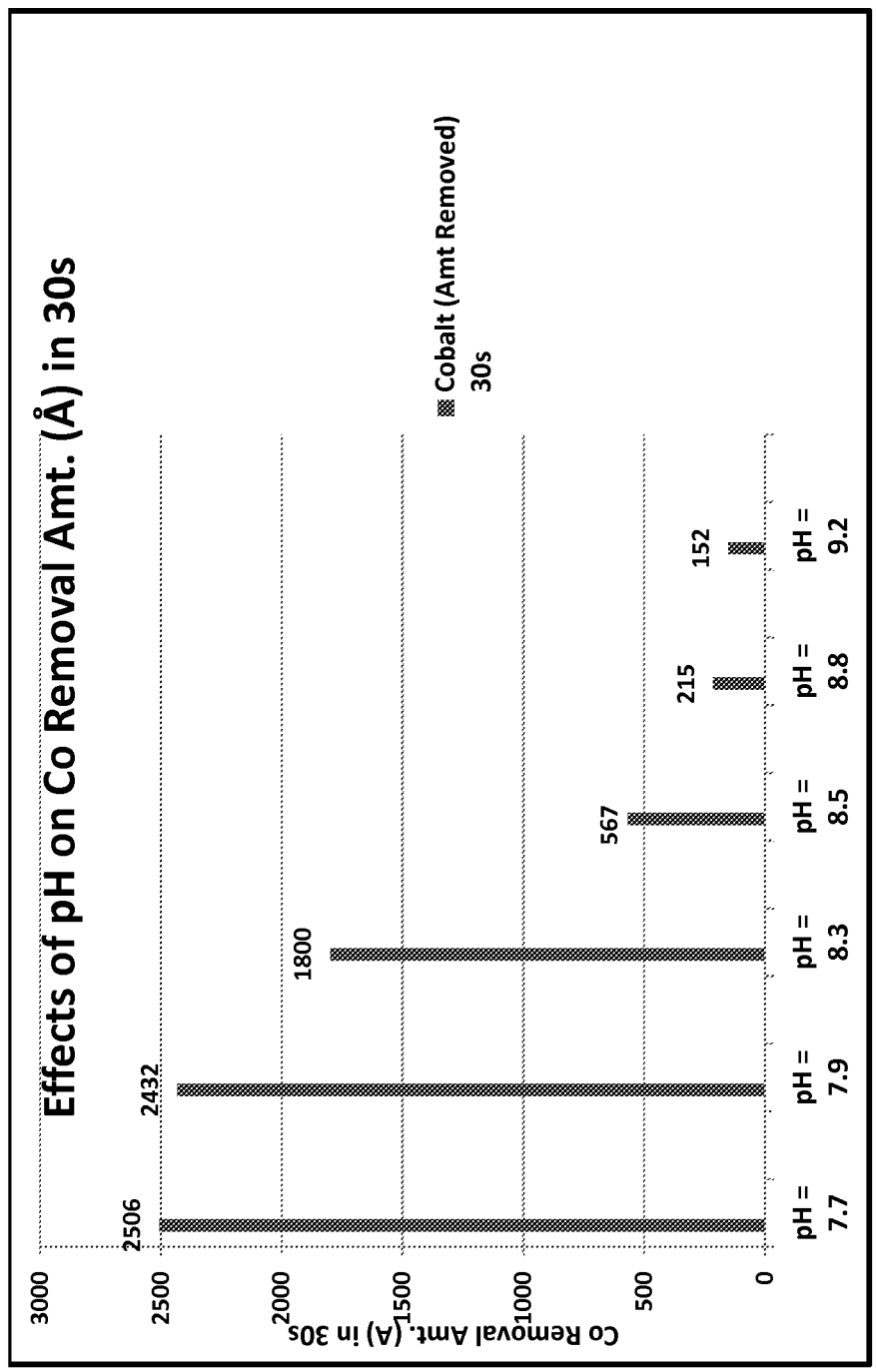
FIGS. 3(A) and 3(B) show Co removal amount (thickness in Å) in 30 s as a function of pH of Co CMP compositions.
Figure 3:
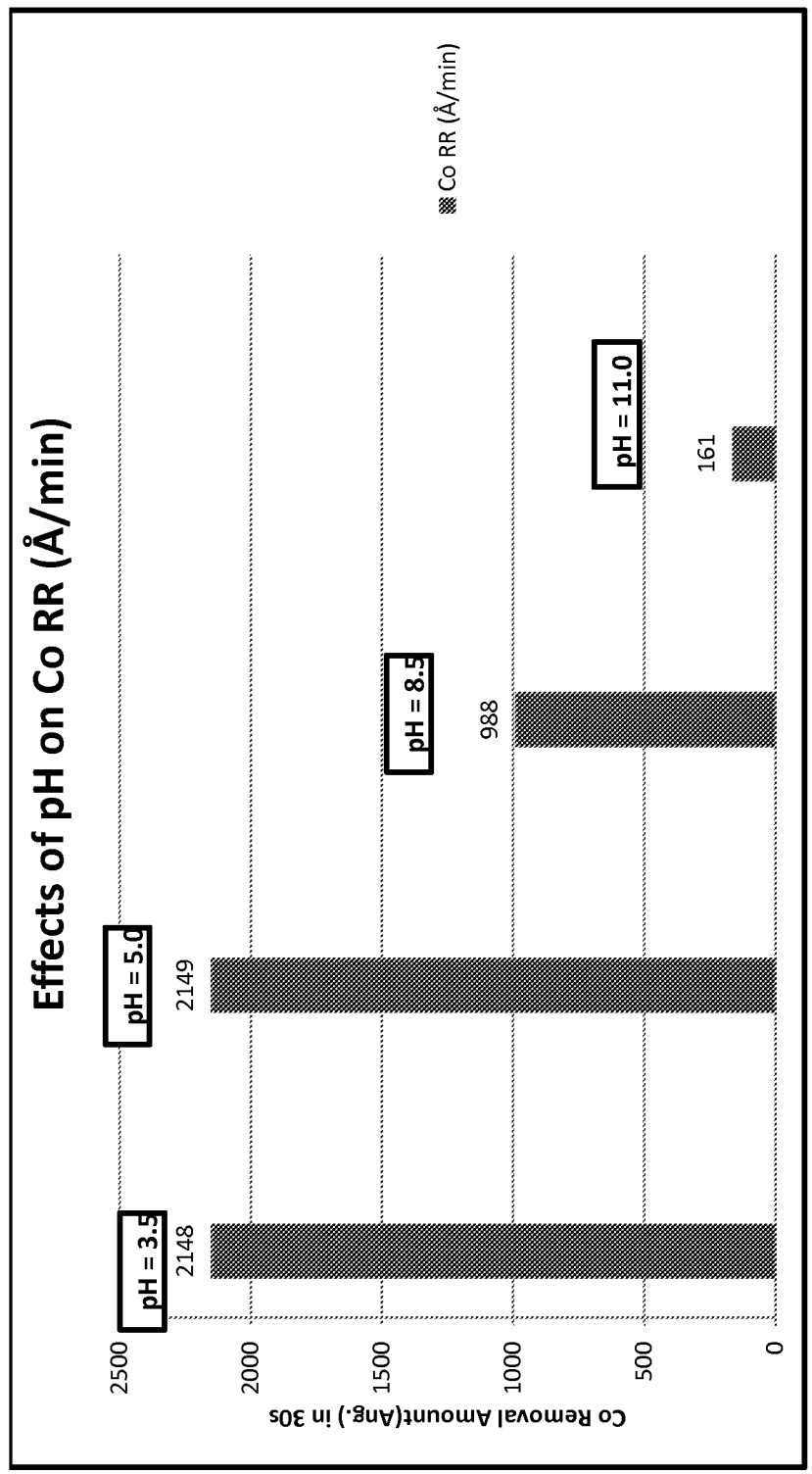

The results from two sets of examples were depicted in FIGS. 3(A) and 3(B).

As the results shown in FIGS. 3(A) and 3(B), pH of Co CMP polishing compositions had a effect on the Co removal rates. Higher Co removal rates were obtained at acidic pH conditions. Similar Co removal rates were achieved at pH=3.5, pH=5.0, pH=7.7 and pH=7.9. Co removal rate was decreased at weak alkaline pH conditions (pH>8.0). When pH=11.0, the Co removal rate was decreased sharply.

Compositions with pH greater or equal 3.5, but less than 8.5 performed well. Compositions with pH ranges from 5.0 to 8.3 performed better.

Example 5

Co bulk CMP polishing compositions were prepared using 0.50 wt % high purity colloidal silica particles (mean particle size was about 72 nm); 0.45 wt % glycine; 0.65 wt % alanine; 0.0002 wt % Kathon II as biocide; 0.002 wt % ethylinediamine; 0.00025 wt % 1,3,5-Tris(2-hydroxyethyl) isocyanurate; 0.095 wt % 3-amino-1,2,4-triazole or 1,2,4-triazole; 0.0075 wt % dynol 607 or 604 surfactant; potassium hydroxide used as pH adjusting agent; and $H_2O_2$ uses as oxidizing agent.

The rest was DI water. pH value for the compositions was around 8.

Various concentrations of $H_2O_2$ were used in the compositions. The Co removal rates of the Co bulk CMP polishing compositions were measured as a function of concentration (wt %) of $H_2O_2$.

Figure 4:
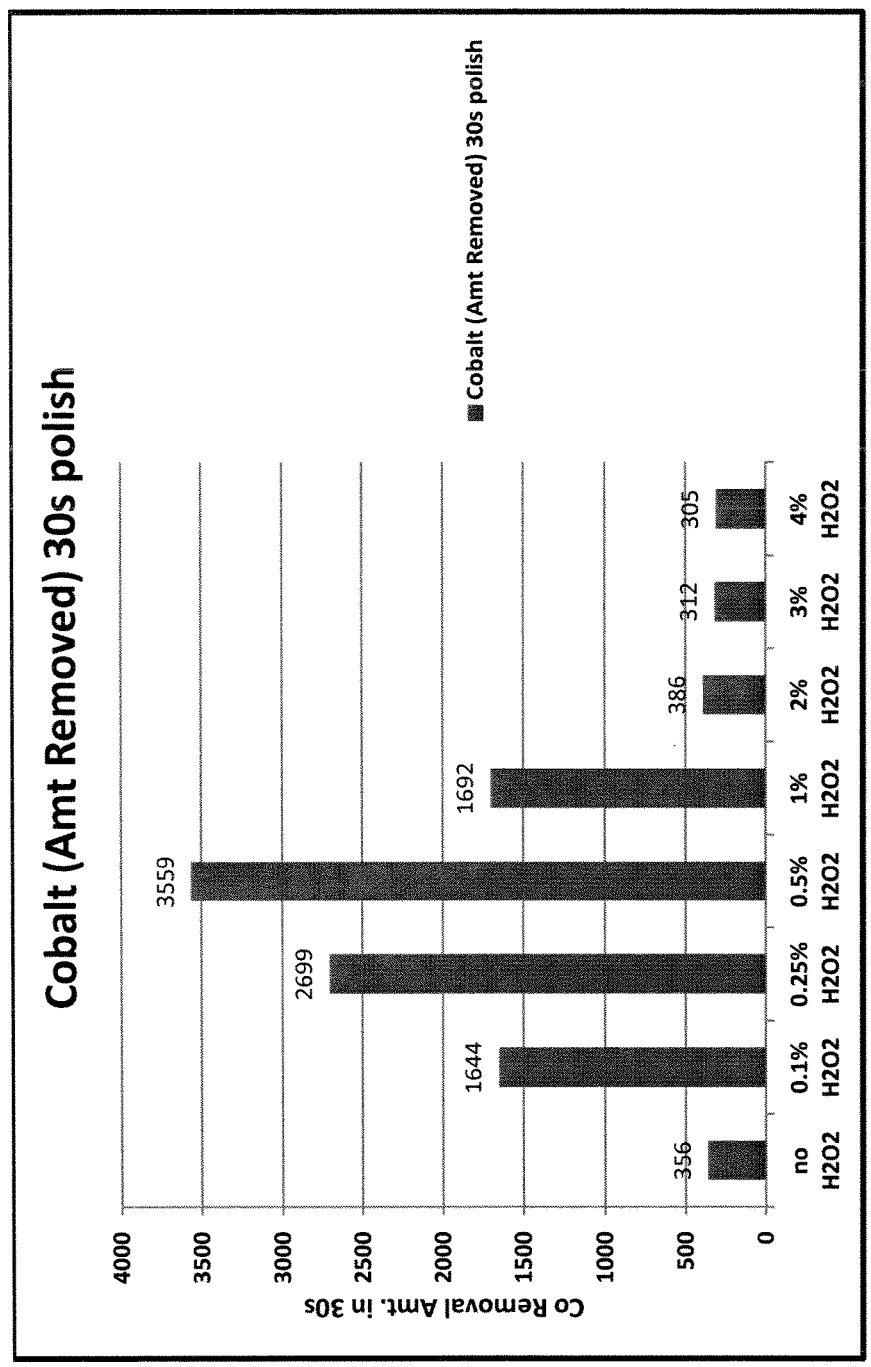
FIG. 4 shows Co removal amount (thickness in Å) in 30 s as a function of $H_2O_2$ in Co CMP compositions.

The results were depicted in FIG. 4.

As the results shown in FIG. 4, the hydrogen peroxide ($H_2O_2$) concentration (wt %) had a effect on the Co removal rates. The highest Co removal rate was achieved with 0.5 wt % $H_2O_2$ concentration. Compositions with $H_2O_2$ concentration ranging from 0.1 wt % to 1 wt % were more preferred. Compositions with $H_2O_2$ concentration ranging from 0.25 wt % to 0.75 wt % were most preferred.

Example 6

Co bulk CMP polishing compositions were prepared using high purity colloidal silica particles (mean particle size was about 72 nm); 0.45 wt % glycine; 0.65 wt % alanine; 0.0002 wt % Kathon II as biocide; 0.002 wt % ethylinediamine; 0.00025 wt % 1,3,5-Tris(2-hydroxyethyl)isocyanurate; 0.095 wt % 3-amino-1,2,4-triazole or 1,2,4-triazole; 0.0075 wt % dynol 607 or 604 surfactant; potassium hydroxide used as pH adjusting agent; and 1.0 wt % $H_2O_2$ uses as oxidizing agent.

The rest was DI water. pH value for the compositions was around 8.

Various concentrations of colloidal silica particles (mean particle size was about 72 nm) were used in the compositions. The Co removal rates of the Co bulk CMP polishing compositions were measured as a function of colloidal silica particle concentrations wt %.

Figure 5:
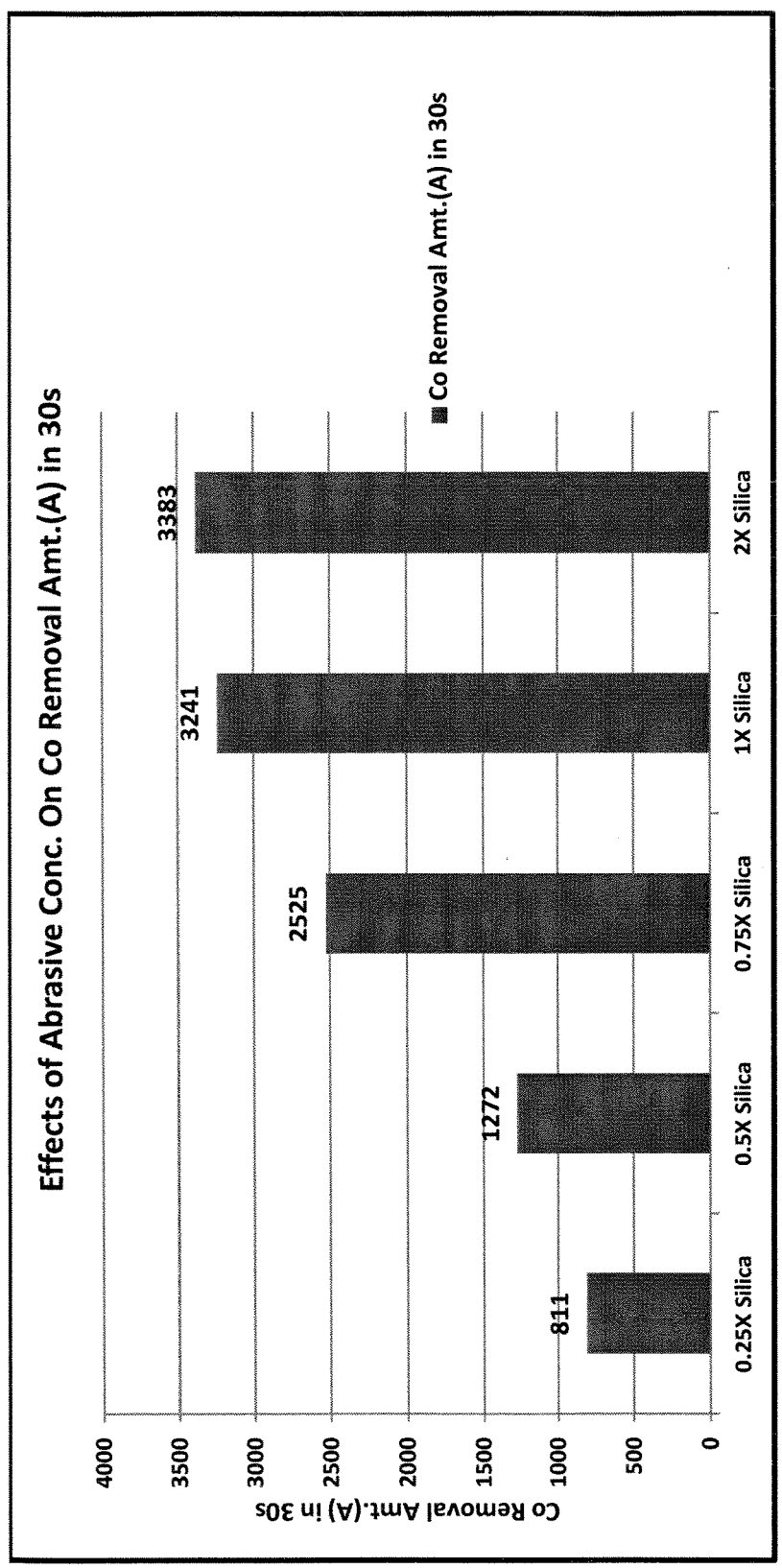
FIG. 5 shows Co removal amount (thickness in Å) in 30 s as a function of concentration of colloidal silica in Co CMP compositions.

The results were depicted in FIG. 5.

As the results shown in FIG. 5, the concentration (wt %) of colloidal silica particles had a effect on Co removal rates. Co removal rates increased as colloidal silica abrasive concentration increased. The increased percentage of Co removal rates became smaller when colloidal silica abrasive concentration increased from 1 wt % to 2 wt %.

Example 7

Co bulk CMP polishing compositions were prepared using 0.50 wt % high purity colloidal silica particles (mean particle size was about 72 nm); 0.45 wt % glycine; 0.65 wt % alanine; 0.0002 wt % Kathon II as biocide; 0.002 wt % ethylinediamine; 0.00025 wt % 1,3,5-Tris(2-hydroxyethyl) isocyanurate; 0.095 wt % 3-amino-1,2,4-triazole; 0.0075 wt % dynol 607 surfactant; potassium hydroxide used as pH adjusting agent; and 1.0 wt % $H_2O_2$ uses as oxidizing agent.

The rest was DI water. pH value of the compositions was around 8.

Various concentrations of dual chelators (glycine and alanine) were used in the compositions. The Co removal rates of the Co bulk CMP polishing compositions were measured as a function of dual chelators concentrations (wt %).

Figure 6:
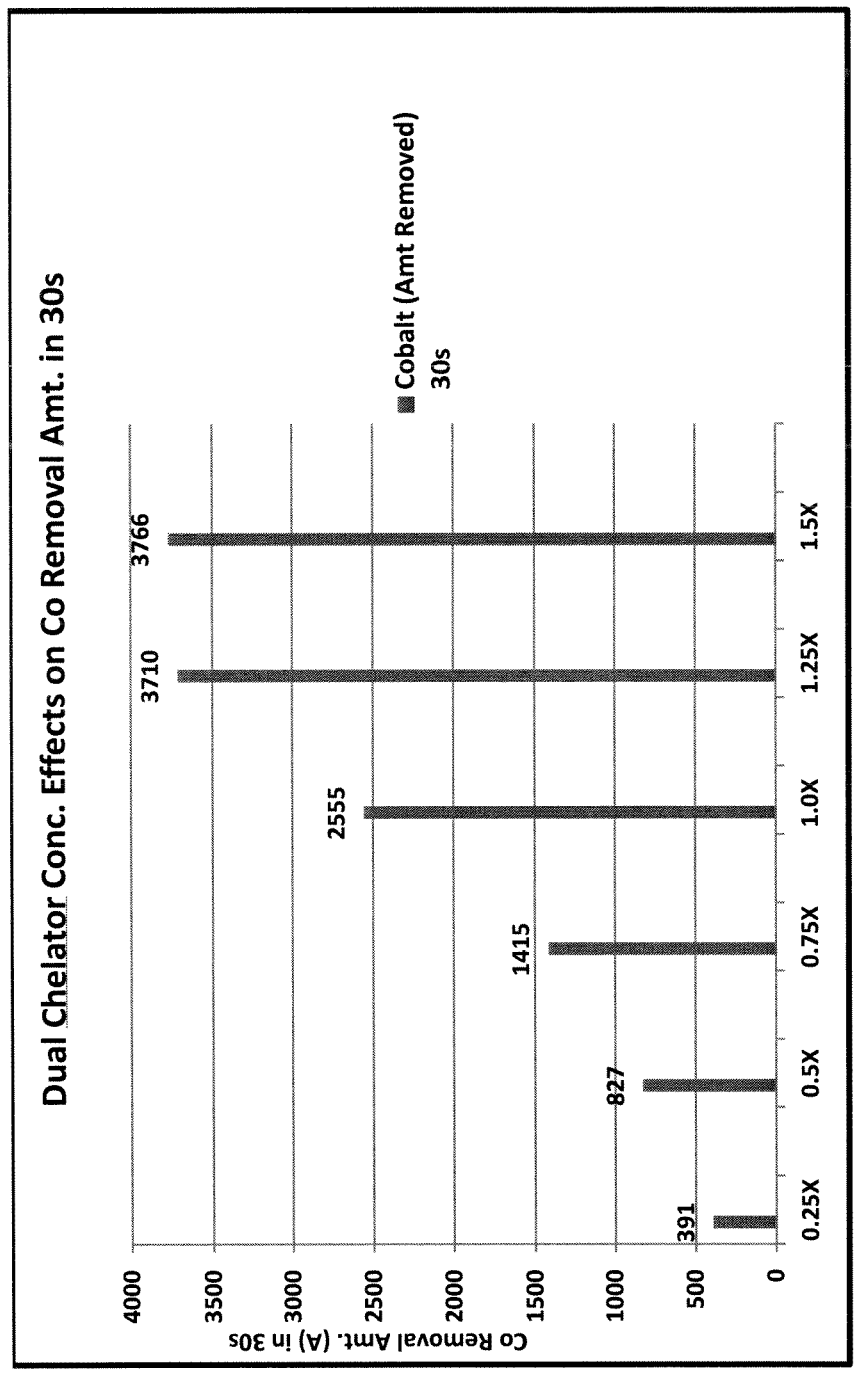
FIG. 6 shows Co removal amount (thickness in Å) in 30 s as a function of concentration of dual chelators in Co CMP compositions.

The results were depicted in FIG. 6.

As the results shown in FIG. 6, dual chelators concentration (wt %) also had a effect on Co removal rates. Co removal rates gradually increased as dual chelator concentration increased from 0.25× (0.275 wt %) to 1.25× (1.375 wt %), (1.65 wt %-1.5×) where 1×=1.1 wt %. After 1.25× concentration condition, the Co removal rates became more flat indicating the threshold was reached. 1.0× to 1.25× dual chelators concentrations were considered the optimized chelators concentrations to afford high Co removal rates. The relative weight % based ratio of two chelators used here is: glycine:alanine=0.6923:1.00.

Examples 4-7 have shown that the Co bulk CMP polishing compositions afforded the tunable Co removal rates opening circuit potentials of Co film. Such tunable Co removal rates were achieved through the optimization of pH condition, optimization of $H_2O_2$ wt %, colloidal silica particle concentration, the overall dual chelators concentration.

One potentially application for the Co bulk CMP polishing compositions having the tunability is to offer the open circuit potential of Co film almost the same as that for Cu film which helps to minimize or eliminate the possible galvanic corrosion reactions at Co/Cu interface.

Example 8

1× Co bulk CMP polishing composition was used as the base in this example.

The composition was prepared using 0.50 wt % high purity colloidal silica particles (about 72 nm particle size); 0.45 wt % glycine; 0.65 wt % alanine (; 0.0002 wt % Kathon II as biocide; 0.002 wt % ethylinediamine; 0.00025 wt % 1,3,5-Tris(2-hydroxyethyl)isocyanurate; 0.0075 wt % dynol 607 surfactant; potassium hydroxide used as pH adjusting agent; and 1.0 wt % $H_2O_2$ uses as oxidizing agent. The rest was DIW. pH value of the compositions was around 8.

Various concentrations of corrosion inhibitor 1,2,4-triazole were used in the compositions, where 1×=0.095 wt % of B2.

The compositions was used to polish Co, BD1 and TEOS materials. The removal rates of Co, BD1 and TEOS were shown in FIG. 7. Removal selectivity of Co vs. BD1; Co vs. TEOS were defined as the ratio of removal rate of Co vs. removal rate of BD1 and the ratio of removal rate of Co vs. removal rate of TEOS.

Figure 7:
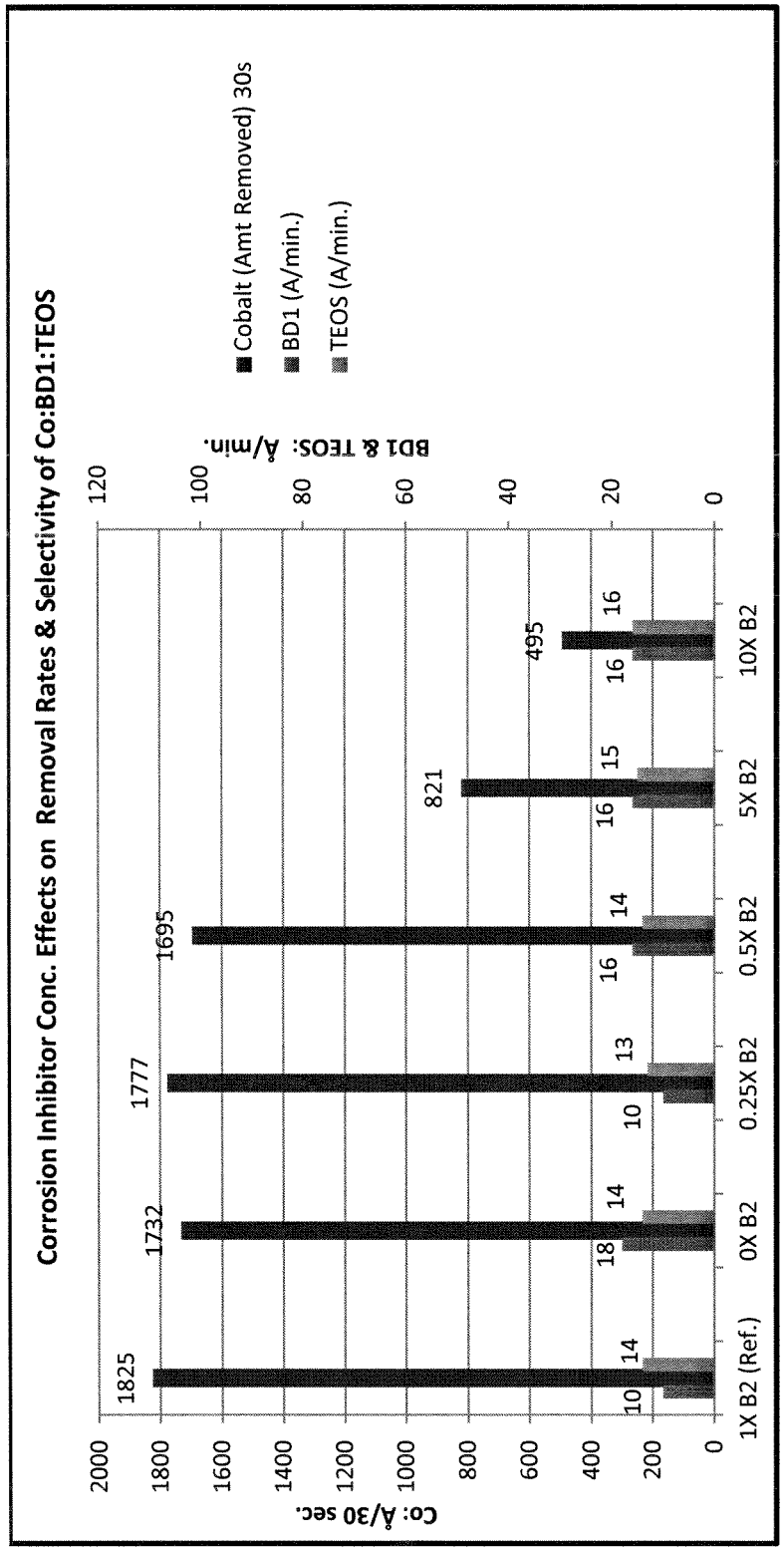
FIG. 7 shows the removal selectivity of Co vs. BD1 (low k film) and Co vs. TEOS (the ratio of removal rate of Co vs. removal rate of BD1 and the ratio of removal rate of Co vs. removal rate of TEOS).

The removal selectivity as a function of concentration of the corrosion inhibitor were shown in FIG. 7.

As data showed in FIG. 7, the changes of corrosion inhibitor concentration impacted Co removal rates which led to the changes in the selectivity of Co:BD1 and Co:TEOS. When the corrosion inhibitor was used at 0×, 0.25×, 0.5×, and 1×, the similar Co removal rates were obtained (from 1695 Å/min. to 1825 Å/min.). When the corrosion inhibitor concentrations increased from 1× to 5× and 10×, Co removal rates were decreased by about 55% and 73% respectively.

The concentration changes of corrosion inhibitor had much less impacts on the removal rates of BD1 and TEOS films.

The selectivity of Co:BD1 and Co:TEOS decreased from 365:1 and 261:1 for 1× corrosion inhibitor to 103:1 and 109:1 for 5× corrosion inhibitor, and 62:1 and 62:1 for 10× corrosion inhibitor, respectively.

Example 9

1× Co bulk CMP polishing composition was used as the base in this example.

The composition was prepared using 0.50 wt % high purity colloidal silica particles (about 72 nm particle size); 0.45 wt % glycine; 0.65 wt % alanine (; 0.0002 wt % Kathon II as biocide; 0.002 wt % ethylinediamine; 0.00025 wt % 1,3,5-Tris(2-hydroxyethyl)isocyanurate; 0.095 wt % 3-amino-1,2,4-triazole; 0.0075 wt % dynol 607 or 604 surfactant; potassium hydroxide used as pH adjusting agent; and 1.0 wt % $H_2O_2$ uses as oxidizing agent. The rest was DIW. pH value of the compositions was around 8.

The compositions was used to polish Co, SiN and TiN materials. The removal rates of Co, SiN, and TiN were shown in FIG. 8. The removal selectivity of Co vs. SiN, Co vs. TiN were defined as the ratio of removal rate of Co vs. removal rate of SiN and the ratio of removal rate of Co vs. removal rate of TiN.

Figure 8:
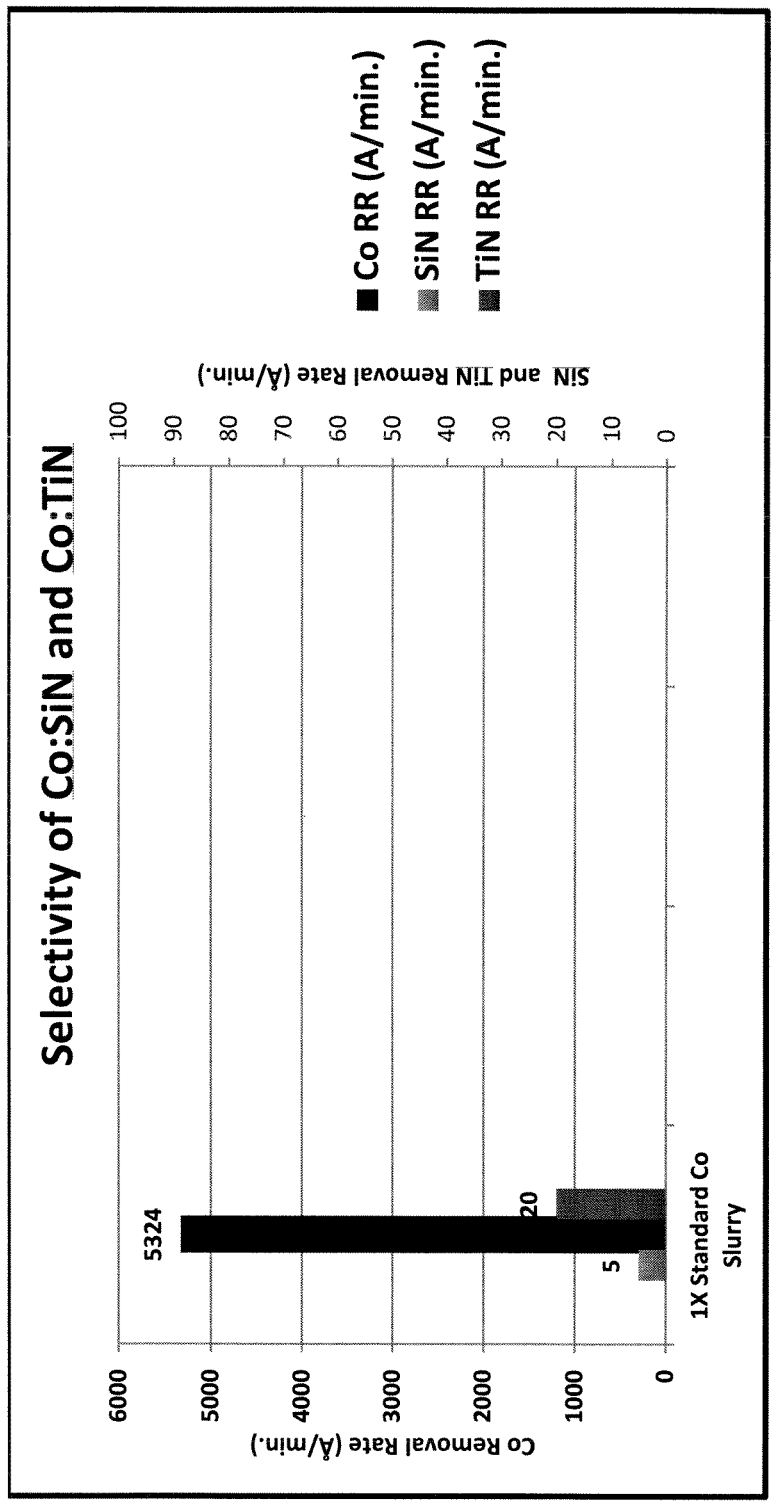
FIG. 8 shows the removal selectivity of Co vs. SiN and Co vs. TiN (the ratio of removal rate of Co vs. removal rate of SiN and the ratio of removal rate of Co vs. removal rate of TiN).

As the data showed in FIG. 8, the Co Bulk CMP removal compositions also afforded higher selectivity towards SiN and TiN films. The removal selectivity for Co:SiN was >738:1, for Co:TiN was >200:1 respectively.

Example 10

Polishing compositions were made with two amino acids, referred to as amino acid 1 and amino acid 2. The amino acids were selected from glycine, Alanine, bicine, tricine and proline.

Specifically, the Co bulk CMP polishing compositions were prepared using 0.50 wt % high purity colloidal silica particles (mean particle size was about 72 nm); 0.65 wt % amino acid 1; 0.45 wt % amino acid 2; 0.0002 wt % Kathon II as biocide; 0.002 wt % ethylenediamine; 0.00025 wt % 1,3,5-Tris(2-hydroxyethyl)isocyanurate; 0.095 wt % 3-amino-1,2,4-triazole; 0.0075 wt % dynol 607; potassium hydroxide used as pH adjusting agent to adjust the pH to 8.0; and 1.0 wt % $H_2O_2$ uses as oxidizing agent. The rest was DI water.

TABLE 4

| Amino Acid 1 | Amino Acid 2 | Amino acid 1 only (1.1 wt %) | Amino acid 2 only (1.1 wt %) | 0.65 wt % Amino Acid 1 + 0.45 wt % Amino Acid 2 |
|---|---|---|---|---|
| Alanine | Glycine | 3141 | 1102 | 4196 |
| Bicine | Glycine | 697 | 1102 | 218 |
| Tricine | Glycine | 443 | 1102 | 223 |
| Proline | Glycine | 2450 | 1102 | 2358 |
| Alanine | Bicine | 3141 | 697 | 2450 |
| Alanine | Tricine | 3141 | 443 | 2358 |
| Alanine | Proline | 3141 | 2450 | 1586 |

Table 4 summarized the cobalt removal data in Angstroms after 30 seconds of polishing at 1 psi pressure and 90 RPM table speed.

The cobalt removal data showed that the combination of glycine and alanine provided a boost in cobalt removal through a synergistic action.

Example 11

Polishing compositions were made comprising glycine and Alanine as the amino acids. The compositions were made with the total concentration of amino acids at 1.1 wt % while varying the relative ratio between glycine and alanine, Specifically, Cobalt bulk CMP polishing compositions were prepared using 0.50 wt % high purity colloidal silica particles (mean particle size was about 72 nm); 0.65 wt % amino acid 1; 0.45 wt % amino acid 2; 0.0002 wt % Kathon II as biocide; 0.002 wt % ethylenediamine; 0.00025 wt % 1,3,5-Tris(2-hydroxyethyl)isocyanurate; 0.095 wt % 3-amino-1,2,4-triazole; 0.0075 wt % dynol 607; potassium hydroxide used as pH adjusting agent to adjust the pH to 8.0; and 1.0 wt % $H_2O_2$ uses as oxidizing agent. The rest was DI water.

Table 5 summarized the cobalt removal data in Angstroms after 30 seconds of polishing at 1 psi pressure and 90 RPM table speed.

Figure 9:
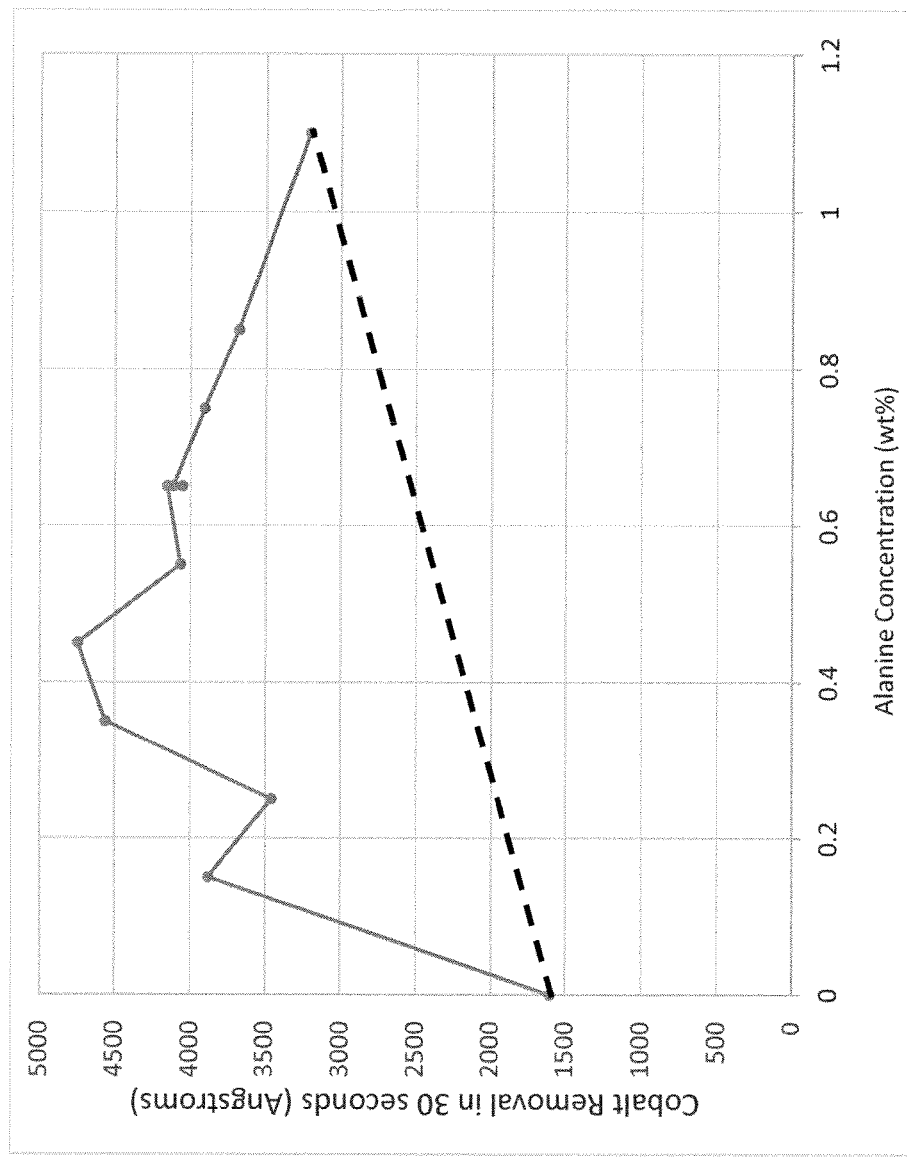
FIG. 9 shows the removal selectivity of Co from the Co CMP compositions comprising glycine and alanine.

The cobalt removal data was also plotted as a function of alanine concentration and was shown in FIG. 9.

TABLE 5

| Alanine (Wt %) | Glycine (Wt %) | Cobalt Removal in 30 seconds |
|---|---|---|
| 0 | 1.1 | 1606 |
| 0.15 | 0.95 | 3879 |
| 0.25 | 0.85 | 3458 |
| 0.35 | 0.75 | 4565 |
| 0.45 | 0.65 | 4747 |
| 0.55 | 0.55 | 4068 |
| 0.65 | 0.45 | 4156 |
| 0.65 | 0.45 | 4056 |
| 0.65 | 0.45 | 4118 |
| 0.75 | 0.35 | 3907 |
| 0.85 | 0.25 | 3676 |
| 1.1 | 0 | 3207 |

The dash line in the data plot was a straight line connecting cobalt removal corresponding to formulation comprising glycine as the only amino acid and cobalt removal corresponding to formulation comprising alanine as the only amino acid. In the absence of any synergestic action, the cobalt removal from the simple mixture of glycine and alanine would have followed this line if the relative ratios of glycine and alanine were varied while fixing the total concentration of the two at a constant value. However, the actual removal rates were shown to be much higher than what predicted by this simple mixture rule. The data indicates unexpected synergistic interaction happened between these two complexing agents, resulting in high cobalt removal rates. While the synergestic action occurred across entire range of the relative ratios between glycine and alanine, the maximum synergestic effect appeared to be evident when alanine was present at concentration of 20-65% relative to the total concentration of amino acids used.

The forgoing working examples had demonstrated that with the combination of dual chelators, the disclosed chemical mechanical polishing (CMP) compositions, methods and system provided desirable high and tunable Co film removal rates. The combination of dual chelators of glycine and alanine had demonstrated the synergestic effect in cobalt removal rates.

The combination of dual chelators also demonstrated reduced Co film static etch rates (SER) for better Co film corrosion protection; minimized or eliminated the possible galvanic corrosion at Co/Cu interface by tuning open circuit potentials of Co and Co films; low barrier film and dielectric film removal rates; high and desirable removal selectivity of cobalt vs. dielectric films such as TEOS, SiNx, low-k, and ultra low-k films, and cobalt vs. barrier films such as Ta, TaN, Ti, and TiN films.

The foregoing examples and description of the preferred embodiments should be taken as illustrating, rather than as limiting the present invention as defined by the claims. As will be readily appreciated, numerous variations and combinations of the features set forth above can be utilized without departing from the present invention as set forth in the claims. Such variations are not regarded as a departure from the spirit and scope of the invention, and all such variations are intended to be included within the scope of the following claims.

The invention claimed is:

1. A method of a selective chemical mechanical polishing comprising:
    a) providing a semiconductor substrate having a surface containing a first material and at least one second material;

wherein the first material is Co and the second material is selected from the group consisting of dielectric film, low-k and ultra low-k film, and barrier film;
b) providing a polishing pad;
c) providing a chemical mechanical polishing composition comprising
0.005 wt % to 25 wt % of an abrasive;
0.05 wt % to 10 wt % of at least two chelators;
DI water; and
at least one selected from the group consisting of:
0.0005 wt % to 0.25 wt % of a chemical additive as corrosion inhibitor or a defect reducing agent;
0.005 wt % to 0.5 wt % of a pH adjusting agent;
0.1 wt % to 10 wt % of an oxidizing agent;
0.0001 wt % to 0.10 wt % of biocide; and
0.0005 wt % to 0.15 wt % of a surfactant;
wherein the chemical mechanical polishing (CMP) polishing composition having a pH from 3.5 to 8.5; and
the at least two chelators are amino acids independently selected from the group consisting of DL-Alanine, D-Alanine, L-Alanine, Glycine, Serine, Proline, Histidine, Isoleucine, Lysine, Methionine, Phenylalanine, Threonine, Tryptophan, Valine, Asparagine, Aspartic acid, Glutamine, Ornithine, Selenocystein, Tyrosine, Sarcosine, Bicine, Tricine, Aceglutamide, N-Acetylaspartic acid, Acetylcarnitine, Acetylcysteine, N-Acetylglutamic acid, Acetylleucine, Acivicin, S-Adenosyl-L-homocysteine, Agaritine, Alanosine, Aminohippuric acid, L-Arginine ethyl ester, Aspartame, Aspartylglucosamine, Benzylmercapturic acid, Biocytin, Brivanib alaninate, Carbocisteine, N(6)-Carboxymethyllysine, Carglumic acid, Cilastatin, Citiolone, Coprine, Dibromotyrosine, Dihydroxyphenylglycine, Eflornithine, Fenclonine, 4-Fluoro-L-threonine, N-Formylmethionine, Gamma-L-Glutamyl-L-cysteine, 4-(γ-Glutamylamino)butanoic acid, Glutaurine, Glycocyamine, Hadacidin, Hepapressin, Lisinopril, Lymecycline, N-Methyl-D-aspartic acid, N-Methyl-L-glutamic acid, Milacemide, Nitrosoproline, Nocardicin A, Nopaline, Octopine, Ombrabulin, Opine, Orthanilic acid, Oxaceprol, Polylysine, Remacemide, Salicyluric acid, Silk amino acid, Stampidine, Tabtoxin, Tetrazolylglycine, Thiorphan, Thymectacin, Tiopronin, Tryptophan tryptophylquinone, Valaciclovir, Valganciclovir, and combinations thereof;
and
d) polishing the surface of the semiconductor substrate to selectively remove the first material;
wherein Co is a metal inter-connection material; at least a portion of the surface is in contact with both the polishing pad and the chemical mechanical polishing composition; and ratio of removal rate of the first material to removal rate of the second material is greater than 1.

2. The method of a selective chemical mechanical polishing of claim 1, wherein the second material is selected from the group consisting of TEOS, SiNx, Ta, TaN, Ti, and TiN wherein x is a number larger than 1.0 and smaller than 1.5.

3. The method of a selective chemical mechanical polishing of claim 2, wherein the ratio of removal rate of the first material to the removal rate of the second material is equal or greater than 60.

4. The method of a selective chemical mechanical polishing of claim 1, wherein the abrasive is selected from the group consisting of nano-sized colloidal silica or high purity colloidal silica particles; nano-sized inorganic metal oxide particles selected from the group consisting of alumina, titania, zirconia, ceria and combinations thereof; nano-sized diamond particles; nano-sized silicon nitride particles; mono-modal, bi-modal, or multi-modal colloidal abrasive particles; organic polymer-based soft abrasives; surface-coated or modified abrasives; and combinations thereof.

5. The method of a selective chemical mechanical polishing of claim 1, wherein
the corrosion inhibitor is selected from the group consisting of 1,2,4-triazole and its derivatives, benzotriazole and its derivatives, 1,2,3-triazole and its derivatives, pyrazole and its derivatives, imidazole and its derivatives, benzoimidazole and its derivatives, benzoimidazole and its derivatives, isocyanurate and its derivatives, and mixtures thereof;
the pH adjusting agent is selected from the group consisting of nitric acid, hydrochloric acid, sulfuric acid, phosphoric acid, sodium hydride, potassium hydroxide, ammonium hydroxide, tetraalkylammonium hydroxide, organic amines, and mixtures thereof;
the oxidizing agent is selected from the group consisting of periodic acid, hydrogen peroxide, potassium iodate, potassium permanganate, ammonium persulfate, ammonium molybdate, ferric nitrate, nitric acid, potassium nitrate, and mixtures thereof;
the biocide is selected from the group consisting of methylisothiazolinone, methylchloroisothiazolinone, and quaternary ammonium compound selected from the group consisting of tetramethylammonium chloride, tetraethylammonium chloride, tetrapropylammonium chloride, alkylbenzyldimethylammonium chloride and alkylbenzyldimethylammonium hydroxide, wherein the alkyl chain ranges from 1 to about 20 carbon atoms; chloro-containing compound selected from the group consisting of chlorite and sodium hypochlorite; biguanide; aldehyde; ethylene oxide; metallic salt, isothiazolinone; indophor; and combinations thereof;
and
the surfactant is selected from the group consisting of non-ionic surfactant selected from the group consisting of alcohol ethoxylates, acetylenic diol surfactants, and combinations thereof; anionic surfactant selected from the group consisting of secondary alkane sulfonates; dodecyl sulfate, sodium salt, lauryl sulfate, potassium salt, and combinations thereof; cationic surfactant selected from the group consisting of quaternary ammonium based surfactant; and amphoteric surfactant selected from the group consisting of betaine and amino acid derivatives based surfactant; and combinations thereof.

6. The method of a selective chemical mechanical polishing of claim 1, wherein the chemical mechanical polishing composition comprising colloidal silica particles; glycine; and alanine selected from the group consisting of DL-Alanine, D-Alanine, and L-Alanine.

7. The method of a selective chemical mechanical polishing of claim 1, wherein the chemical mechanical polishing composition comprising colloidal silica particles; glycine; DL-alanine; methylisothiazolinone; methylchloroisothiazolinone; ethylenediamine; 1,3,5-Tris(2- hydroxyethyl)isocyanurate; 3-amino-1,2,4-triazole; ethoxylated acetylenic diol surfactant; potassium hydroxide; and $H_2O_2$.

\* \* \* \* \*